(12) United States Patent
Liao et al.

(10) Patent No.: US 8,740,633 B2
(45) Date of Patent: Jun. 3, 2014

(54) CONNECTOR FOR CASH BOX

(75) Inventors: Wenjun Liao, Guangzhou (CN); Lei Wen, Guangzhou (CN)

(73) Assignee: GRG Banking Equipment Co., Ltd., Guangzhou, Guangdong (CN)

( * ) Notice: Subject to any disclaimer, the term of this patent is extended or adjusted under 35 U.S.C. 154(b) by 155 days.

(21) Appl. No.: 13/393,883

(22) PCT Filed: Aug. 13, 2010

(86) PCT No.: PCT/CN2010/075969
§ 371 (c)(1),
(2), (4) Date: Mar. 2, 2012

(87) PCT Pub. No.: WO2011/035660
PCT Pub. Date: Mar. 31, 2011

(65) Prior Publication Data
US 2012/0155956 A1     Jun. 21, 2012

(30) Foreign Application Priority Data

Sep. 22, 2009 (CN) .......................... 2009 1 0192582

(51) Int. Cl.
    *H01R 13/44*         (2006.01)
(52) U.S. Cl.
    USPC .......................................................... 439/137
(58) Field of Classification Search
    CPC ............... H01R 13/447; H01R 13/443; H01R 13/4532; H01R 13/3536; H01R 13/4538
    USPC .......................................... 439/135–138, 142
    See application file for complete search history.

(56) References Cited

U.S. PATENT DOCUMENTS 6,422,885 B2 *    7/2002    Kain et al. ..................... 439/247
6,592,387 B2 *    7/2003    Komenda et al. ............. 439/247

(Continued)

FOREIGN PATENT DOCUMENTS

CN     200990436 Y    12/2007
CN     101211477 A    7/2008

(Continued)

OTHER PUBLICATIONS

International Search Report dated Nov. 25, 2010 from corresponding International Application No. PCT/CN2010/075969.

(Continued)

*Primary Examiner* — Xuong Chung Trans
(74) *Attorney, Agent, or Firm* — Wolf, Greenfield & Sacks, P.C.

(57) ABSTRACT

A connector for a cash box comprises a male connector (20) disposed on the cash box (2) and a female connector (10) disposed on a cash box bracket (1). An elastic element (11) is disposed on the cash box bracket (1) and provides the female connector (10) with a thrust for matching the male connector (20) tightly. The elastic element (11) is further connected with a floating board (14) and provides the floating board (14) with a supporting force along the assembly direction of the cash box (2). A protecting cover device (30) is further disposed on the cash box bracket (1), located over the female connector (10), and comprises a protection cover bracket (31), a resetting torsion spring (33), and a cover body (32). The cover body (32) is pivoted to the protection cover bracket (31) with a shaft (34). The resetting torsion spring (33) is sleeved on the shaft (34), located between the cover body (32) and the protection cover bracket (31), and provides the cover body (32) with a torque force to cover the female connector (10) without any external force. The cover body (32) is opened by the side wall of the cash box to complete the connection when the cash box (2) is assembled.

5 Claims, 4 Drawing Sheets

(56) References Cited

U.S. PATENT DOCUMENTS

| | | |
|---|---|---|
| 7,258,560 B2 * | 8/2007 | Scafidi et al. ............... 439/248 |
| 7,641,484 B2 | 1/2010 | Cha et al. |
| 8,366,468 B2 * | 2/2013 | Carnevali ..................... 439/248 |
| 2008/0287015 A1 | 11/2008 | Cha et al. |

FOREIGN PATENT DOCUMENTS

| | | |
|---|---|---|
| CN | 201112913 Y | 9/2008 |
| GB | 2341015 A | 3/2000 |
| JP | 2008027861 A | 2/2008 |
| KR | 20070068550 A | 7/2007 |

OTHER PUBLICATIONS

Extended European Search Report dated Feb. 26, 2013 from corresponding European Application No. EP 10818354.

* cited by examiner

CONNECTOR FOR CASH BOX

The present application is the national phase of International Application No. PCT/CN2010/075969, titled "CONNECTOR FOR CASH BOX", filed on Aug. 13, 2010, which application claims the benefit of priority to Chinese patent application No. 200910192582.7 titled "CONNECTOR FOR CASH BOX", filed with the Chinese State Intellectual Property Office on Sep. 22, 2009. The entire disclosures thereof are incorporated herein by reference.

FIELD OF THE INVENTION

The present invention relates to a connector in a self-service financial instrument, and more particularly, to a connector between a cash box and a cash box bracket.

BACKGROUND OF THE INVENTION

At present, the wiring device to be disconnected frequently in the self-service financial instrument mostly adopts the socket device for connector. The socket device for connector facilitates the application of the wiring device to be disconnected frequently. However, the socket device for connector has the following disadvantages due to its structural character.

First, the connection and insertion of the connector is required to be precise, stable and reliable. Especially, there is a strict requirement on the gap between a male connection member and a female connection member of a connector in a connecting-inserting direction. If the gap is slightly beyond the requirement, the improper contact will occur.

Second, the male connection member and the female connection member of a connector are fixed to two different separable devices, respectively. Taking the connector for the cash box as an example, the male connection member thereof is generally fixed inside the cash box, while the female connection member is generally fixed to a cash box bracket. This imposes a strict requirement on the machining precision and the assembling error. Accordingly, the machining cost is increased, and it is difficult to ensure the precision.

In addition, the male connection member and the female connection member are disconnected by pulling them upwardly and downwardly, respectively, which is very convenient to operate. However, they have the following disadvantages.

First, when the male connection member is fixed upwardly, dust is prone to be adhered thereto, and foreign matters are easily hanged thereon, which will cause a connection failure.

Second, when the female connection member is fixed upwardly, foreign matters likely fall therein, and it is difficult to clean them out, which will cause a connection failure.

Therefore, it is very important to develop an improved connector for a cash box which can overcome the above disadvantages.

SUMMARY OF THE INVENTION

The object of the present invention is to provide a connector for a cash box, i.e., a connector device between a cash box and a cash box bracket in a self-service financial instrument, which may ensure the safety, the stability and the reliability of the signal connection when the cash box is placed into or pulled out from the cash box bracket, and reduces the requirement on the machining precision and the assembling error of parts used to fix the connector, thereby decreasing the machining costs and reducing the complexity of assembling operation.

The further object of the present invention is to provide a connector for a cash box which can avoid the connection failure caused by the dust or the foreign matters falling into the female connection member.

In order to achieve the above objects, the present invention provides a connector for a cash box including a male connection member located on a cash box and a female connection member located on a cash box bracket, wherein an elastic element is provided on the cash box bracket and configured to exert a pushing force to the female connection member so that the female connection member is closely engaged with the male connection member.

Preferably, the cash box bracket is provided with at least one guiding bar extending in an assembly direction of the cash box, and the elastic element and the female connection member are configured to be sleeved on the at least one guiding bar in sequence.

Preferably, the elastic element is connected to a floating board and exerts a supporting force to the floating board in an assembly direction of the cash box. The female connection member is disposed on the floating board and is backwardly and forwardly movable along with the floating board in the assembly direction of the cash box. More preferably, the cash box bracket is provided with at least one guiding bar extending in the assembly direction of the cash box, and the elastic element and the floating board are configured to be sleeved on the at least one guiding bar in sequence.

Preferably, the elastic element is a spring.

Preferably, a protection cover device is further provided on the cash box bracket and located above the female connection member. The protection cover device includes a protection cover bracket, a return torsion spring and a cover body. The cover body is pivotally connected to the protection cover bracket through a shaft. The return torsion spring is configured to be sleeved on the shaft and located between the cover body and the protection cover bracket. The return torsion spring exerts a torsion force to the cover body so that the cover body covers the female connection member without any external force.

Preferably, a top of the cover body is divided into a first part located at one side of the shaft and a second part located at the other side of the shaft. The first part mainly covers the female connection member, and the second part is provided with a protruding portion on its upper surface. Preferably, the protruding portion includes a pair of protruding ribs which are perpendicular to the shaft.

Since the cash box bracket is provided with an elastic element, the elastic element exerts a pushing force to the female connection member so that the female connection member is closely mated with the male connection member. Thus, when the cash box is inserted, a tight connection and a good contact between the female connection member and the male connection member are ensured, which may ensure the safety, the stability and the reliability of the signal connection when the cash box is placed into or pulled out from the cash box bracket. In addition, the protection cover is provided to avoid the connection failure caused by the dust or the foreign matters falling into the male connector. In particular, when the cash box is placed, the protection cover is opened automatically since the protruding portion of the top of the cover body is actuated by the bottom edge of the cash box, which ensures that the connector is successfully connected. Besides, after the cash box is pulled out, the protection cover is closed automatically by the return torsion spring, and plays a role of protection.

DETAILED DESCRIPTION

Hereinafter, the technical solutions in embodiments of the present invention will be described clearly and completely with reference to drawings of the embodiments of the present invention. It is apparent that the embodiments to be described are merely a portion of embodiments of the present invention, but not all of the embodiments. Based on the embodiments of the present invention, all of other embodiments made by those skilled in the art without inventive effort fall into the protection scope of the present invention.

Figure 1:
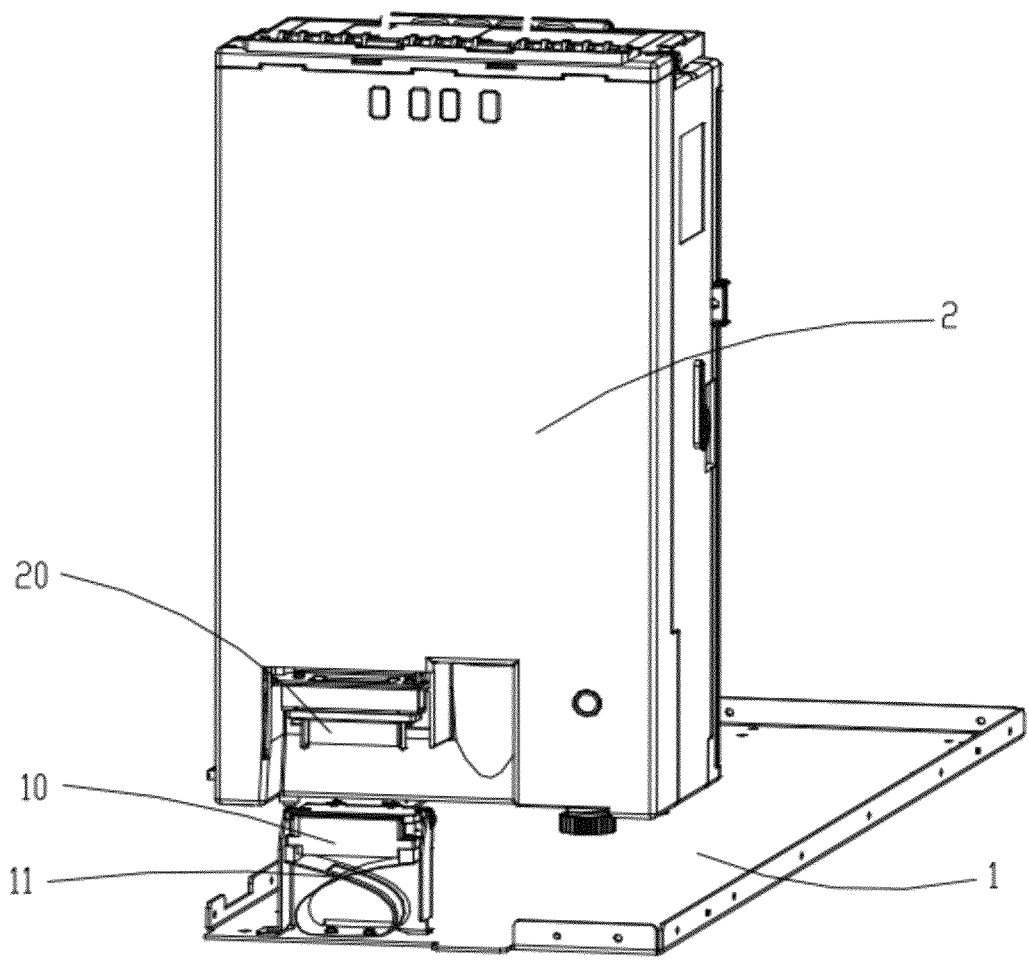
FIG. 1 is a schematic structural view of a connector for a cash box according to a preferred embodiment of the present invention.

Referring to FIG. 1, the connector for the cash box according to this embodiment includes a female connection member 10 located on a cash box bracket 1 and a male connection member 20 located on a cash box 2. This cash box bracket 1 is provided with an elastic element 11. The elastic element 11 exerts a pushing force to the female connection member 10 such that the female connection member 10 is closely mated with the male connection member 20. When the cash box 2 is placed, the male connection member 20 is inserted into the female connection member 10. Thus, the cash box 1 imparts a certain pressure to the female connection member 10, which deforms the elastic element 11 to a certain extent. The female connection member 10 is closely mated with the male connection member 20 by a return force generated from the deformed elastic element 11. The elastic element 11 shown in FIG. 1 is of a sheet-like elastic structure, which symmetrically supports the female connection member 10. It should be understood that the elastic element 11 is not limited to the sheet-like elastic structure, and it may be other shapes of sheet-like elastic structure, or may be a spring, a torsion spring and so on, as long as it can support the female connection member 10 and exert a uniform pushing force to the female connection member 10.

Figure 2:
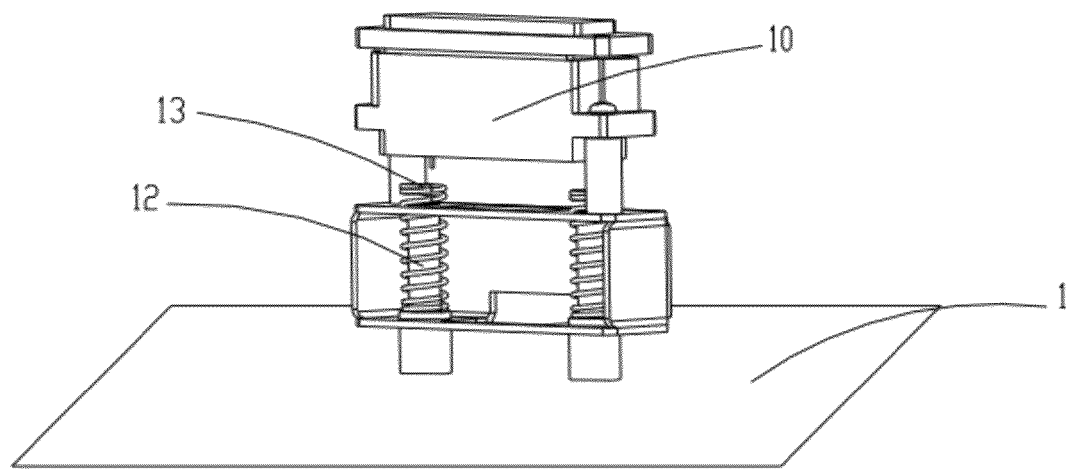
FIG. 2 is a schematic structural view showing one end of a female connection member of a connector for a cash box according to another preferred embodiment of the present invention.

As shown in FIG. 2, in a case that the elastic element 11 is a spring(s) 13, the cash box bracket 1 may be further provided with a guiding bar(s) 12 extending in a direction along which the cash box is inserted. The spring(s) 13 is sleeved on the guiding bar(s). The female connection member 10 may also be sleeved on the guiding bar(s) 12. The spring(s) 13 supports the female connection member 10. The female connection member 10 is movable along the guiding bar(s) 12 forwardly and backwardly. That is, the female connection member 10 is backwardly and forwardly movable in the direction along which the cash box is inserted.

Figure 3:
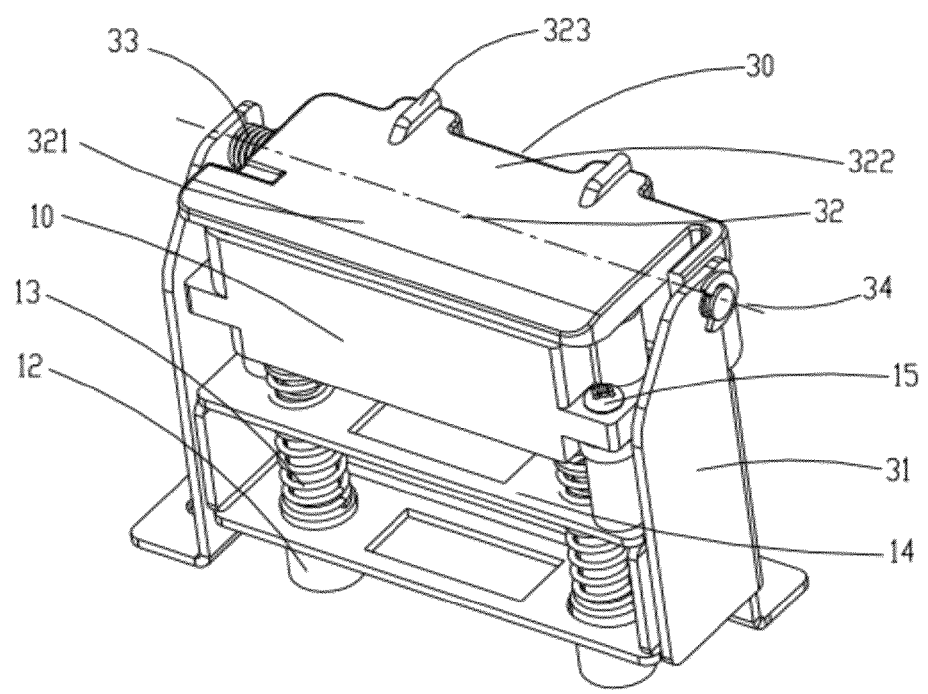
FIG. 3 is a schematic structural view showing one end of a female connection member of a connector for a cash box according to a third preferred embodiment of the present invention.

Referring to FIGS. 1 and 3, compared with the above-described connector for the cash box in FIG. 1, a connector for a cash box according to a second embodiment of the present invention has a relatively complex structure for supporting the female connection member 10, and includes two guiding bars 12 extending from the cash box bracket 1 in the direction along which the cash box 2 is inserted. The springs 13 and a floating board 14 are sleeved on the guiding bars 12. The female connection member 10 is disposed on the floating board 14. The floating board 14 is movable along the guiding bars 12 forwardly and backwardly, so as to drive the female connection member 10 to move along the guiding bars 12 forwardly and backwardly. The springs 13 support the floating board 14, and exert a supporting force to the floating board 14 in an extending direction of the guiding bar 12. When the cash box 2 is placed, the male connection member 20 is inserted into the female connection member 10, and at the same time, the cash box 1 imparts a certain pressure to the female connection member 10 to deform the springs 12. Thus, the floating board 14 is pushed by the return force generated from the deformed springs 13, so that the female connection member 10 on the floating board 14 is closely mated with the male connection member 20. In this embodiment, the floating board 14 mainly plays a role of fastening and guiding the female connection member 10. The female connection member 10 is fastened to the floating board 14 with screws 15. In this way, the female connection member 10 is fastened in an up-down direction, but may be moved within a narrow range in a back-forth direction and a left-right direction, which allows the male connection member 20 to be more easily engaged with the female connection member 10.

Figure 4:
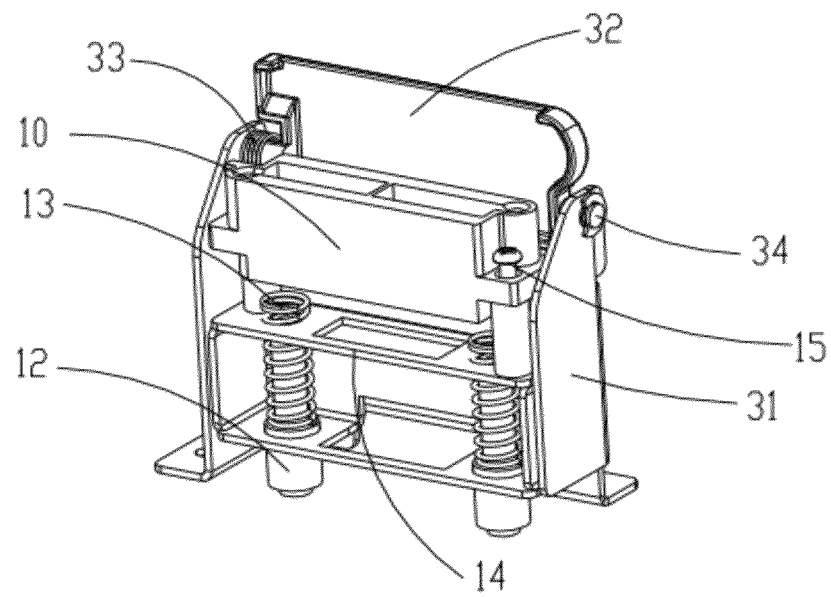
FIG. 4 is a schematic structural view of the female connection member in FIG. 3 with a protective cover thereof being opened.

In order to prevent the female connection member 10 from being dirty with dust, a protection cover device 30 is further provided above the female connection member 10. In a closed state, the protection cover device 30 covers the female connection member 10. The protection cover device 30 in FIG. 3 is in the closed state, while the protection cover device 30 in FIG. 4 is in an open state. The protection cover device 30 includes a protection cover bracket 31, a cover body 32 and a return torsion spring 33. The cover body 32 is pivotally connected to the protection cover bracket 31 through a shaft 34. The return torsion spring 33 is sleeved on the shaft 34, and located between the cover body 32 and the protection cover bracket 31. The return torsion spring 33 exerts a torsion force to the cover body 32, so that the cover body 32 covers the female connection member 10 or returns the cover body 32 from the open state into the closed state without any external force. Referring to FIG. 3, the top of the cover body 32 is divided into two parts along a line defined by the shaft 34, i.e., a first part 321 mainly covering the female connection member 10, and a second part 322 provided with a pair of protruding ribs 323.

Figure 5:
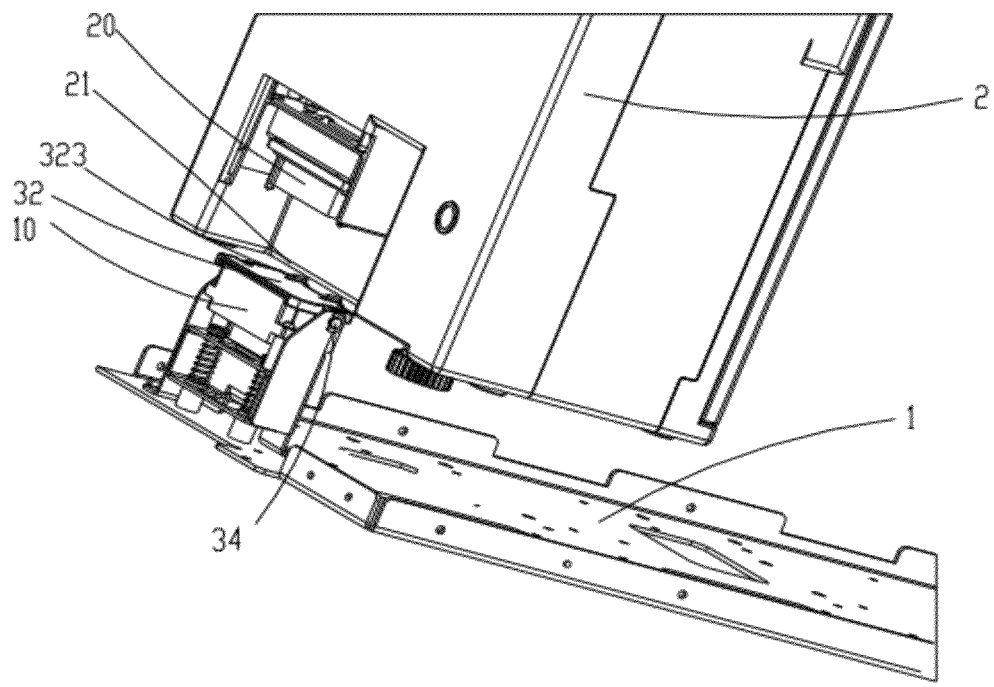
FIG. 5 is a schematic view illustrating the process that the cash box is placed in the third embodiment, which shows a state that the bottom edge of the cash box just comes into contact with the protection cover of the female connection member.
Figure 6:
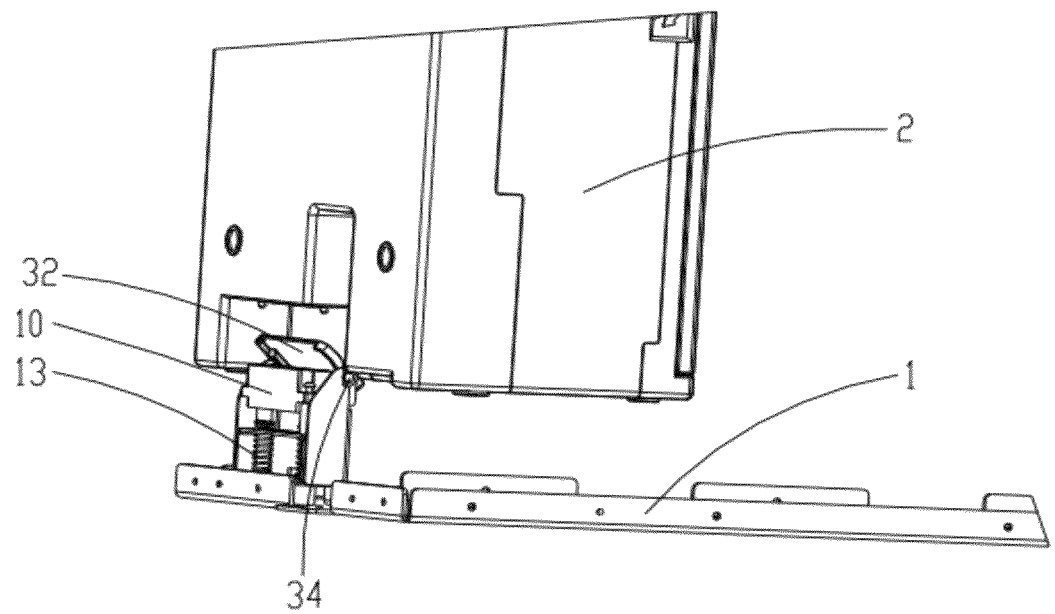
FIG. 6 is a schematic view illustrating the next process that the cash box is further placed into a cash box bracket in the third embodiment, which shows a state that the protection cover of the female connection member is opened by the bottom edge of the cash box.
Figure 7:
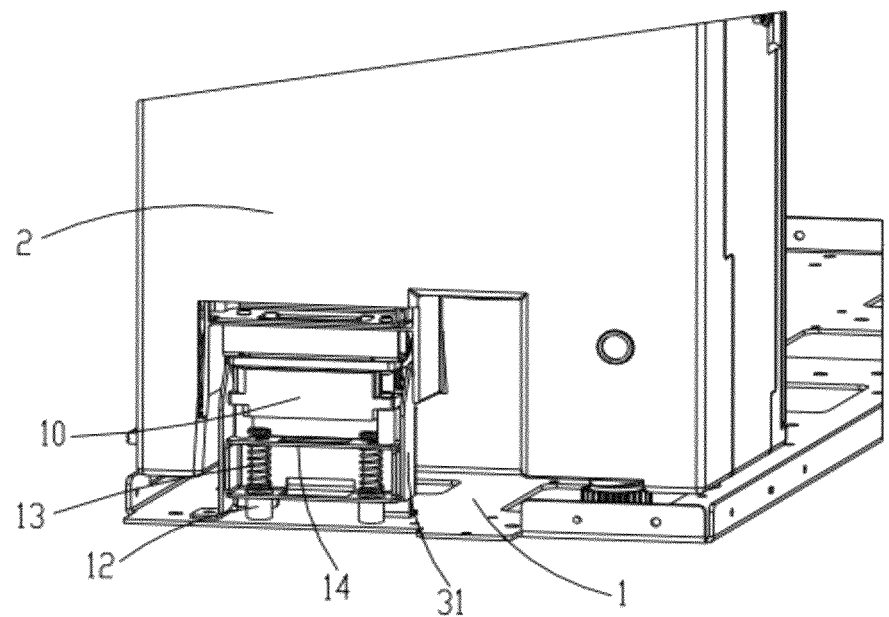
FIG. 7 is a schematic view showing the connection of the connector after the cash box is put in place.

As shown in FIGS. 3, 4 and 5, when the cash box 2 is placed, a bottom edge 21 of the cash box 2 firstly comes into contact with the protruding ribs 323. As the cash box 2 is placed, the bottom edge 21 imparts a downward pressure to the protruding ribs 323, so that the cover body 32 rotates around the shaft 34, i.e., the second part 322 moves downwardly and the first part 321 is raised. As a result, the cover body 32 is opened. As shown in FIG. 6, when the female connection member 10 is completely exposed, the male connection member 20 on the cash box 2 may be just inserted into the female connection member 10. As shown in FIG. 7, it is a schematic view showing that the male connection member 20 is mated with the female connection member 10. At this moment, the cash box 2 is placed into the cash box bracket 1, and the male connection member has been easily engaged into the female connection member.

When the cash box 2 is pulled out, the cover body 32 is returned by the return torsion spring 33, and covers the female connection member 10 again to protect the female connection member 10.

Such structure of the protection cover may be also applied to the other female connection members shown in FIGS. 1 and 2.

Since the cash box bracket is provided with an elastic element, such as sheet-like elastic element or spring, the elastic element exerts a pushing force to the female connection member so that the female connection member is closely mated with the male connection member. Thus, when the cash box is inserted, a tight connection and a good contact between the female connection member and male connection member are ensured, which may ensure the safety, the stability and the reliability of the signal connection when the cash box is placed into or pulled out from the cash box bracket.

In addition, the protection cover is provided to avoid the connection failure caused by dust or foreign matters falling into the male connection member. In particular, when the cash box is placed, the protection cover is opened automatically since the protruding portion of the top of the cover body is actuated by the bottom edge of the cash box, which ensures that the connector is successfully connected. Besides, after the cash box is pulled out, the protection cover is closed automatically by the return torsion spring, and plays a role of protection.

While the preferred embodiments of the present invention have been described above, it is not intended to limit the protection scope of the present invention. Therefore, various equivalent variations made by those skilled in the art based on the contents described in the Description and illustrated in drawings of the present invention fall into the protection scope of the present invention.

What is claimed is:

1. A connector for a cash box, comprising a male connection member located on a cash box and a female connection member located on a cash box bracket, wherein an elastic element is provided on the cash box bracket, and configured to exert a pushing force to the female connection member so that the female connection member is closely engaged with the male connection member;
   a protection cover device is provided on the cash box bracket and located above the female connection member, the protection cover device comprises a protection cover bracket, a cover body, and a return torsion spring,
   the cover body is pivotally connected to the protection cover bracket through a shaft,
   the return torsion spring is configured to be sleeved on the shaft and located between the cover body and the protection cover bracket, and the return torsion spring exerts a torsion force to the cover body so that the cover body covers the female connection member without any external force,
   a top of the cover body is divided into a first part located at one side of the shaft and a second part located at the other side of the shaft, the first part mainly covers the female connection member, and the second part is provided with a protruding portion on its upper surface, and
   the protruding portion comprises a pair of protruding ribs which are perpendicular to the shaft and are configured to cooperate with a bottom edge of the cash box so as to open the cover body.

2. The connector for the cash box according to claim 1, wherein the cash box bracket is provided with at least one guiding bar extending in an assembly direction of the cash box, the elastic element and the female connection member are configured to be sleeved on the at least one guiding bar in sequence.

3. The connector for the cash box according to claim 1, wherein the elastic element is connected to a floating board and exerts a supporting force to the floating board in an assembly direction of the cash box, and the female connection member is disposed on the floating board and is backwardly and forwardly movable along with the floating board in the assembly direction of the cash box.

4. The connector for the cash box according to claim 3, wherein the cash box bracket is provided with at least one guiding bar extending in the assembly direction of the cash box, the elastic element and the floating board are configured to be sleeved on the at least one guiding bar in sequence.

5. The connector for the cash box according to claim 1, the elastic element is a spring.

\* \* \* \* \*